United States Patent [19]

Yoda et al.

[11] Patent Number: 5,149,975
[45] Date of Patent: Sep. 22, 1992

[54] PATTERN FABRICATION METHOD USING A CHARGED PARTICLE BEAM AND APPARATUS FOR REALIZING SAME

[75] Inventors: Haruo Yoda; Fumio Murai, both of Tokyo, Japan

[73] Assignee: Hitachi, Ltd., Tokyo, Japan

[21] Appl. No.: 647,562

[22] Filed: Jan. 29, 1991

[30] Foreign Application Priority Data

Jan. 31, 1990 [JP] Japan ................................. 2-19028

[51] Int. Cl.$^5$ .......................................... H01J 37/304
[52] U.S. Cl. .................................. 250/492.2; 250/398
[58] Field of Search ........................... 250/492.22, 398

[56] References Cited

U.S. PATENT DOCUMENTS 4,950,910  8/1990  Yasuda et al. ...................... 250/398

OTHER PUBLICATIONS

JP-A-58-32420 Feb. 1983, (only abstract).
JP-A-59-139625 Aug. 1984 (only abstract).
JP-A-61-284921 Dec. 1986 (only abstract).
J. Vac. Technol. B3(1), Jan./Feb. 1985 pp. 165–173.
J. Vac. Technol. B7(6), Nov./Dec. 1989 pp. 1524–1527.
J. Appl. Phys. 54(6) Jun. 1983 pp. 3573–3581.
"Variable Spot Shaping for Electron-Beam Lithography" H. C. Pfeiffer 14th Symposium on Electron pp. 887–890.

*Primary Examiner*—Bruce C. Anderson
*Attorney, Agent, or Firm*—Antonelli, Terry, Stout & Kraus

[57] ABSTRACT

The present application relates to a method and an apparatus for forming a pattern, in which a plane on which a pattern on a sample is traced is decomposed into predetermined partial regions; the pattern density in each of the partial regions is stored in data storing means as pattern density map data; and the irradiation energy amount of a charged particle beam is corrected on the basis of the pattern density map data to correct shortage and excess in the exposure dose due to roughness and fineness of the the pattern, i.e. the proximity effect. Further, the present application relates to a method and an apparatus for forming a pattern, in which when one or a plurality of layers located under the layer on which the pattern should be formed have patterns, influences of the underlayers on the proximity effect are taken into account.

22 Claims, 9 Drawing Sheets

EXPOSED FIGURE ON SAMPLE SURFACE

ADDRESS IN DATA STORING DEVICE
CORRESPONDING TO ADDRESS OF PARTIAL REGION

| | |
|---|---|
| 0 | 15 |
| 1 | 25 |
| 2 | 30 |
| 3 | 20 |
| 4 | 25 |
| 5 | 45 |
| 6 | 30 |
| 7 | 15 |
| 8 | 20 |
| ... | |
| 15 | |

EXPOSURE DOSE MAP DATA

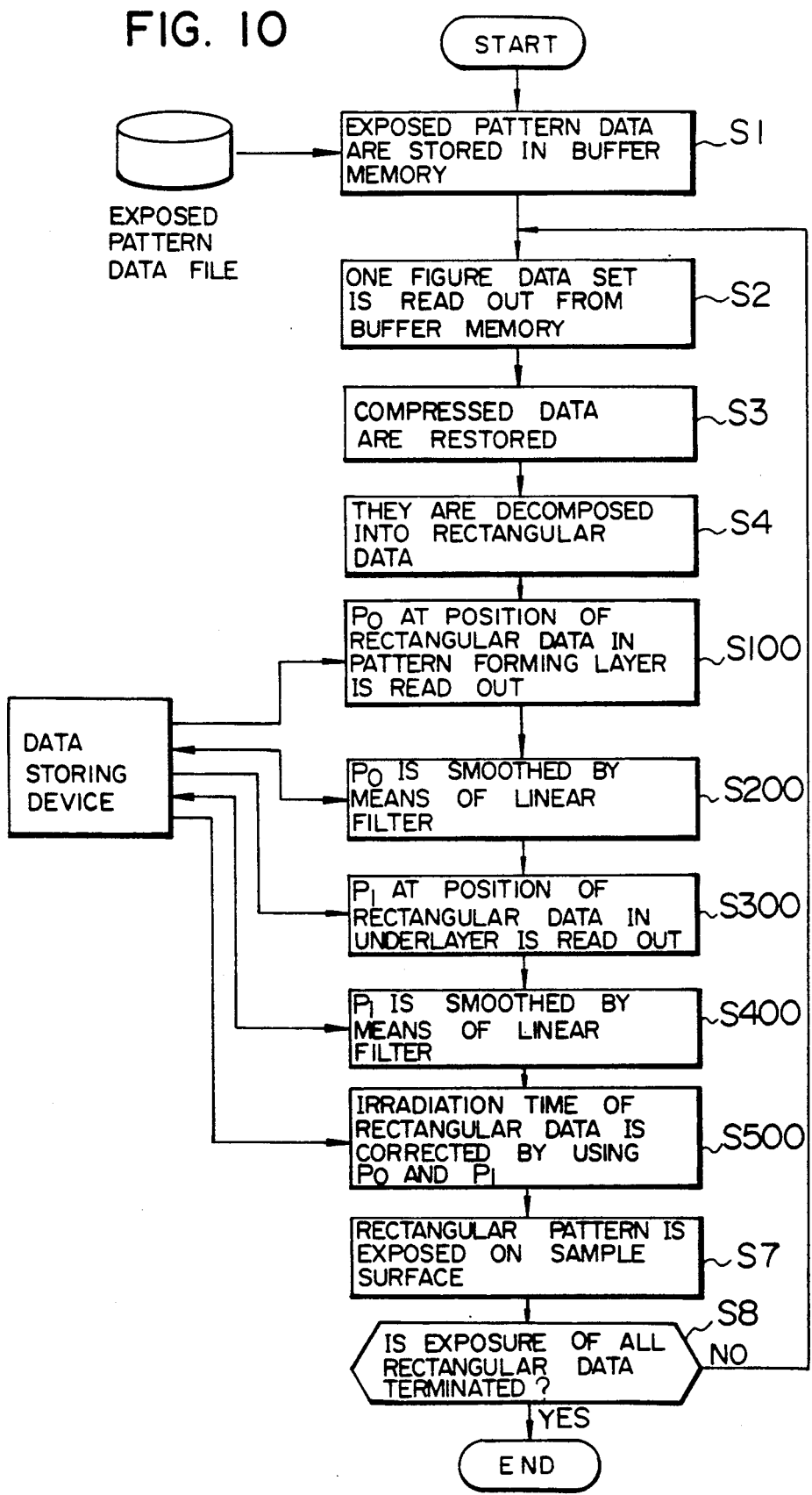

PATTERN FABRICATION METHOD USING A CHARGED PARTICLE BEAM AND APPARATUS FOR REALIZING SAME

BACKGROUND OF THE INVENTION

The present invention relates to a pattern fabrication method using a charged particle beam and an apparatus for realizing the same, and in particular it provides a pattern fabrication method and a device for realizing the same suitable for fabricating semiconductor integrated circuits having an extremely high degree of integration.

The circuit pattern for semiconductor integrated circuits has become finer and finer without interruption and tracing by using a charged particle beam having a high resolving power has been used for forming the fine pattern. Even by using a charged particle beam having a high resolving power, when the pattern becomes further finer, a phenomenon takes place that an interval between two parts close to each other in a large figure is further narrowed, which gives rise to a problem in the formation of fine patterns. This phenomenon is one of the most serious problems in the fine pattern exposure by means of a charged particle beam and it is known in general as the proximity effect. The cause of this phenomenon consists in that projected charged particles pass through a beam energy sensitive product (hereinbelow called resist) to enter a semiconductor substrate and that a part of charged particles scattered in the substrate, for example, returns again to the surface of the resist to expose it thereto. The effect of this reexposure is equivalent to a charged particle beam pattern faded in a large extent being projected again lightly thereon. As a result, since the exposure at a dense part in the pattern becomes an excessive exposure, this gives rise to the phenomenon that the interval is varied, as described above.

Heretofore, in order to reduce influences of this proximity effect, various contrivances have been made on the pattern to be exposed.

A first method therefor consists in that deformations in the pattern to be exposed due to the proximity effect are previously calculated and that modifications for compensating them are carried out previously on the pattern to be exposed. That is, since a small interval is further reduced in size by the proximity effect, as described previously, small interval parts are looked for previously in the exposure pattern data and the width of the figure is reduced by a suitable degree on both sides so that the small interval parts are enlarged. In this way, even if the small interval parts are further narrowed by the proximity effect, a figure having a desired size can be formed.

A second method therefor is a method by which the dose is varied at the exposure so that the proximity effect is compensated. As described previously, since the proximity effect is produced by the fact that a faded exposure pattern is reexposed, if the exposure is effected so that changing parts in the pattern are emphasized so as to compensate fading, a pattern similar to that obtained by performing a desired exposure can be formed as the result of the fading. For example, each of the figures are decomposed and only the contour portion is taken out, which is exposed for a longer time than the central portion. In this way, a pattern is exposed in which the high frequency component of the exposure pattern is emphasized, which cancels the effect of the low frequency component emphasis due to the fading, and exposure by which influences of the proximity effect are reduced in some degree can be effected.

Further, as a third method, there is known a method by which the irradiation dose with the charged particle beam is varied depending on the exposed area ratio per unit area, i.e. pattern density. Since the proximity effect is caused by excessive exposure, if the irradiation time is shortened at the place where the exposed area ratio is high, and the irradiation time is lengthened at the place where the exposed area ratio is low. In order to execute this correcting method, an algorithm for a computer inputting data for the exposure in an electron beam exposure system is specifically designed. The idea of varying the exposure time depending on the exposed area ratio has been already disclosed also in JP-A-58-32420, 59-139625 and 61-284921 and thus it is known that this method is useful for correcting the proximity effect. Further refer to J. Vac. Sci. Technol. B3 (1), Jan/Feb, 1985, pp. 165–173, J. Vac. Sci. Technol. B7 (6), Nov/Dec, 1989, pp. 1524–1527, and J. Appl. Phys. 54 (6), June, 1983, pp. 3573–3581.

As described above, the proximity effect can be removed in the principle by pattern processing. However the number of exposure patterns for recent high density integrated circuits reaches such a tremendous value that it exceeds several millions in total. The processing of these patterns has reached an enormous amount and calculation for only one circuit pattern took from several tens to more than several hundreds of hours even with a super large scale computer. In addition, in the present situation, this calculation time increases rapidly with increasing degree of integration of the pattern and in realistic terms the execution thereof was difficult.

SUMMARY OF THE INVENTION

The object of the present invention is to solve radically such a problem on the calculation time for correcting the proximity effect and to make it possible in realistic terms to expose an extremely fine pattern by means of a charged particle beam exposure system.

In order to achieve the above object, according to the present invention, a plane, on which a pattern is exposed, is decomposed into predetermined partial regions; the density of the pattern in each of the partial regions is stored in data storing means as pattern density map data; the irradiation energy of a charged particle beam is corrected on the basis of the pattern density map data so that shortage and excess of the exposure dose due to roughness and fineness of the pattern, i.e. the proximity effect, is corrected.

The correction theory on the exposure dose of the beam on the basis of the map data described above will be explained below.

It is supposed that a photosensitive layer disposed on a substrate is irradiated with an electron beam as indicated in FIG. 1, in which I represents the amount of the irradiation energy of the electron beam; E1 the amount of stored energy in the photosensitive layer due to the incident electron beam; and E2 the amount of stored energy in the photosensitive layer due to scattered electrons returning from the substrate to the photosensitive layer. Further, the ratio of the amount of total energy of E2 to E1 for the same incident beam is defined as $k_0$.

At this time, supposing that each pattern to be exposed is extremely small and that the area density therein has a constant value $p_0$, since the amount of stored energy from the back scattering is $p_0 \times E2$ on average, the following equations are valid:

Amount of energy at a place where there is a pattern $$= E1 + p_0 \times E2$$

$$= (1 + p_0 \times k_0) \times E1$$

Amount of energy at a place, where there is no pattern $$= p_0 \times E2$$

$$= p_0 \times k_0 \times E1 \qquad (1)$$

Consequently, at the real pattern exposure, the average $\{(1+p_0 \times k_0) \times E1 + p_0 \times k_0 \times E1\}/2$ of the stored energy at the place where there is a pattern, and the place where there is no pattern may determine the exposure irradiation electron energy I so as to be in accordance with the optimum exposure level $\theta$ for developing the given photosensitive layer.

Although it is supposed here that the area density $p_0$ is a constant which doesn't depend on the position on the photosensitive layer, in practice $p_0$ is a function depending on the position. However, since the back scattering is hardly influenced by fine spatial variations, the thought described above ($p_0$ constant) can be applied approximately, as it is in a partial region even if the position varies. According to this thought, it can be understood that the real optimum irradiation energy amount I may be given by;

$$I = I_0 \times \{1/(1 + 2 \times p_0 \times k_0)\} \qquad (2)$$

However, it is supposed that the electron beam irradiation energy amount I is proportional to E1. Further, $I_0$ means the optimum irradiation energy amount, when it is supposed that there is no back scattering. Still, the energy ratio $k_0$ and the optimum irradiation energy amount $I_0$ are parameters obtained previously by experiments, etc.

Consequently, if the pattern density $p_0$ is given for every partial region, the irradiation energy amount I with the electron beam suitable for exposing the pattern just as designed can be obtained for every partial region by correcting the proximity effect.

In the above, the method for correcting the proximity effect on the basis of the exposure pattern density has been described quantitatively. The present invention can be extended to a method by which a pattern is exposed while correcting not only influences of the density of the pattern in the course of the exposure, but also influences of the pattern in the underlayer which has been already exposed. Now the method for correcting the proximity effect, taking the influences of the pattern in the underlayer into account will be described below. In the case where the pattern to be exposed is a semiconductor wafer pattern, in many cases the pattern in the underlayer has been already exposed on the substrate and several materials having properties different just as their patterns are different are deposited. In such a case, the ratio k of the back scattering can differ remarkably at the place where there is a pattern in the underlayer and at the place where there is none, and there are cases where it is impossible to realize any satisfactory correction by the correction described above for which k is constant. However, in such a case, the correction can be effected by executing a processing as described below.

The influences of the presence or absence of the pattern in the underlayer appears in the ratio k of the stored energies due to the back scattering described above. Denoting k for the place where there is no pattern in the underlayer by $k_0$ and k for the place where there exists a pattern in whole in the underlayer by $k_1$, k when the area density of the pattern in the underlayer is $p_1$ is given as follows: a linear interpolation by;

$$k = k_0 + (k_1 - k_0) \times p_1 \qquad (3)$$

Substituting this k for $k_0$ in the equations of correction (1) and (2) and rearranging them, the following equation is obtained:

$$\begin{aligned}
I &= I_0 \times [1/\{1 + 2 \times p_0 \times (k_0 + (k_1 - k_0) \times p_1)\}] \\
&= I_0 \times [1/\{1 + 2 \times p_0 \times k_0 \times (1 + (k_1/k_0 - 1) \times p_1)\}]
\end{aligned} \qquad (4)$$

where $p_0$ represents the area density of the pattern to be exposed.

Since $I_0$, $k_0$ and $K_1$ are in Eq. (4) parameters obtained previously by experiments, etc., if the pattern densities $p_1$ and $p_0$ can be obtained for every partial region on the sample surface, the amount of the electron beam energy suitable for exposing a pattern as designed can be obtained for every relevant partial region, while correcting the proximity effect and taking also the influences of the pattern in the underlayer into account.

Further, putting $$P = p_0 \times \{1 + (k_1/k_0 - 1) \times p_1\} \qquad (5)$$

in Eq. (4) and substituting this P for $p_0$ in Eq. (2), the optimum irradiation energy amount can be obtained, also in the case where there exists a pattern in the underlayer, in the same way as in the case where there is no pattern therein.

This idea can be extended also to the case where the underlayer is divided into a plurality of layers. That is, also in the case where the underlayer is composed of two layers, putting $p_{10}$ for the pattern density at a place on the pattern in the first layer of the underlayer where there is no pattern in the second layer;

$p_{01}$ for the pattern density at a place on the pattern in the second layer of the underlayer where there is no pattern in the first layer;

$p_{11}$ for the pattern density at a place both on the pattern in the first layer and on the pattern in the second layer;

$k_{10}$ for the ratio of the exposure due to the back scattering at a place on the pattern in the first layer of the underlayer, where there is no pattern in the second layer;

$k_{01}$ for the ratio of the exposure due to the back scattering at a place on the pattern in the second layer of the underlayer, where there is no pattern in the first layer; and $k_{11}$ for the ratio of the exposure due to the back scattering at a place both on the pattern in the first layer and on the pattern in the second layer; and calculating a new area density p by using;

$$\begin{aligned}
P = &\; p_0 \times \{1 + (k_{10}/k_0 - 1) \times p_{10} + \\
&\; (k_{01}/k_0 - 1) \times p_{01} + (k_{11}/k_9 - 1) \times p_{11}\}
\end{aligned} \qquad (6)$$

the correction can be effected by using this P completely in the same way as for the pattern in the first layer. Also in the case where the underlayer is divided into more than two layers, this method can be applied as well.

That is, even if the underlayer has some influences on the proximity effect, if exposure dose map data are formed for the underlayer and a pattern to be exposed is synthesized by using the exposure dose map data and Eqs. (5) and (6), the correction can be effected completely in the same manner as for the case where there are no influences of the underlayer.

In the above explanation, the area density of the pattern calculated from the pattern to be exposed was used for $p_0$ as it was. However, in practice, since the exposure due to the back scattering is extended to a relatively wide region, it is necessary to use values $\bar{p}_0$ obtained by smoothing spatially the distribution of the area density of the pattern. In this case, since the domain of the back scattering varies depending on the material of the underlayer, the domain of the smoothing should be calculated differently depending on the material of the underlayer. For example, in the case where the underlayer is made of a material having a high reflection coefficient such as tungsten, the domain of the smoothing should be smaller than that usually used. For example, in Eq. (7) expressing a two-dimensional smoothing filter function:

$$p'_0(i,j) = \sum_{l,m} a(l,m) \times p_0(i + l, j + m) \quad (7)$$

l and m are in a domain from $-3$ to $+3$.

Further, in the case where the correction is effected taking influences of a plurality of layers into account, the pattern density P' which is to be substituted for $p_0$ in Eq. (2), can be obtained also from Eq. (8):

$$P(i,j) = b_0 + b_1 \times p_1(i,j) + b_2 \times p_2(i,j) + b_3 \times p_1(i,j) \times p_2(i,j) \quad (8)$$

where a(l,m), $b_0$, $b_1$, $b_2$ and $b_3$ are arbitrary parameters.

BRIEF DESCRIPTION OF THE DRAWINGS

FIG. 10 is a flow chart indicating the operation of an electron beam exposure system which is another embodiment.

DESCRIPTION OF THE PREFERRED EMBODIMENTS

Figure 1:
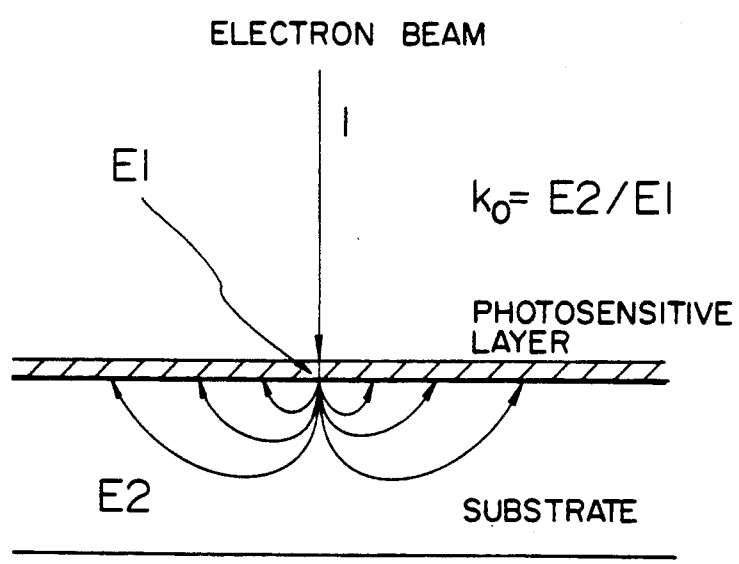
FIG. 1 is a cross-sectional showing the back scattering of an electron beam.
Figure 2:
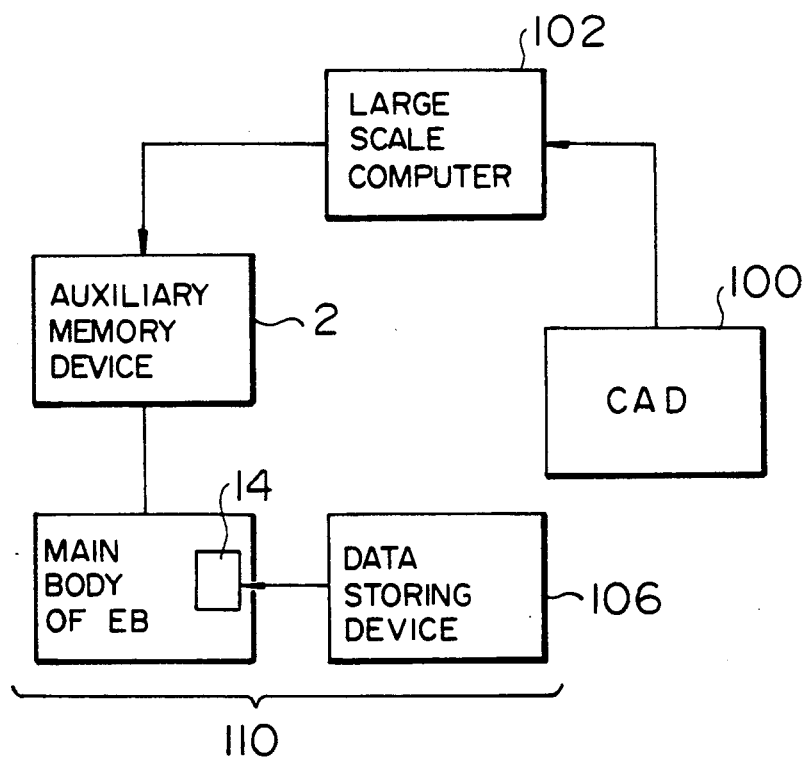
FIG. 2 is a block diagram indicating the whole construction of a pattern forming apparatus in an embodiment of the present invention.

FIG. 2 shows the construction of a device for forming a pattern for a high density integrated circuit.

A pattern designed by means of a CAD device 100 is treated by a large scale computer 102 to obtain data for exposure. By the prior art technique the proximity effect was corrected by using a processing algorithm for the computer 102. In the present embodiment the large scale computer 102 is not provided with any special algorithm for correcting the relevant proximity effect. Exposure pattern data obtained by the large scale computer 102 are stored once in an auxiliary memory device 2.

Figure 3:
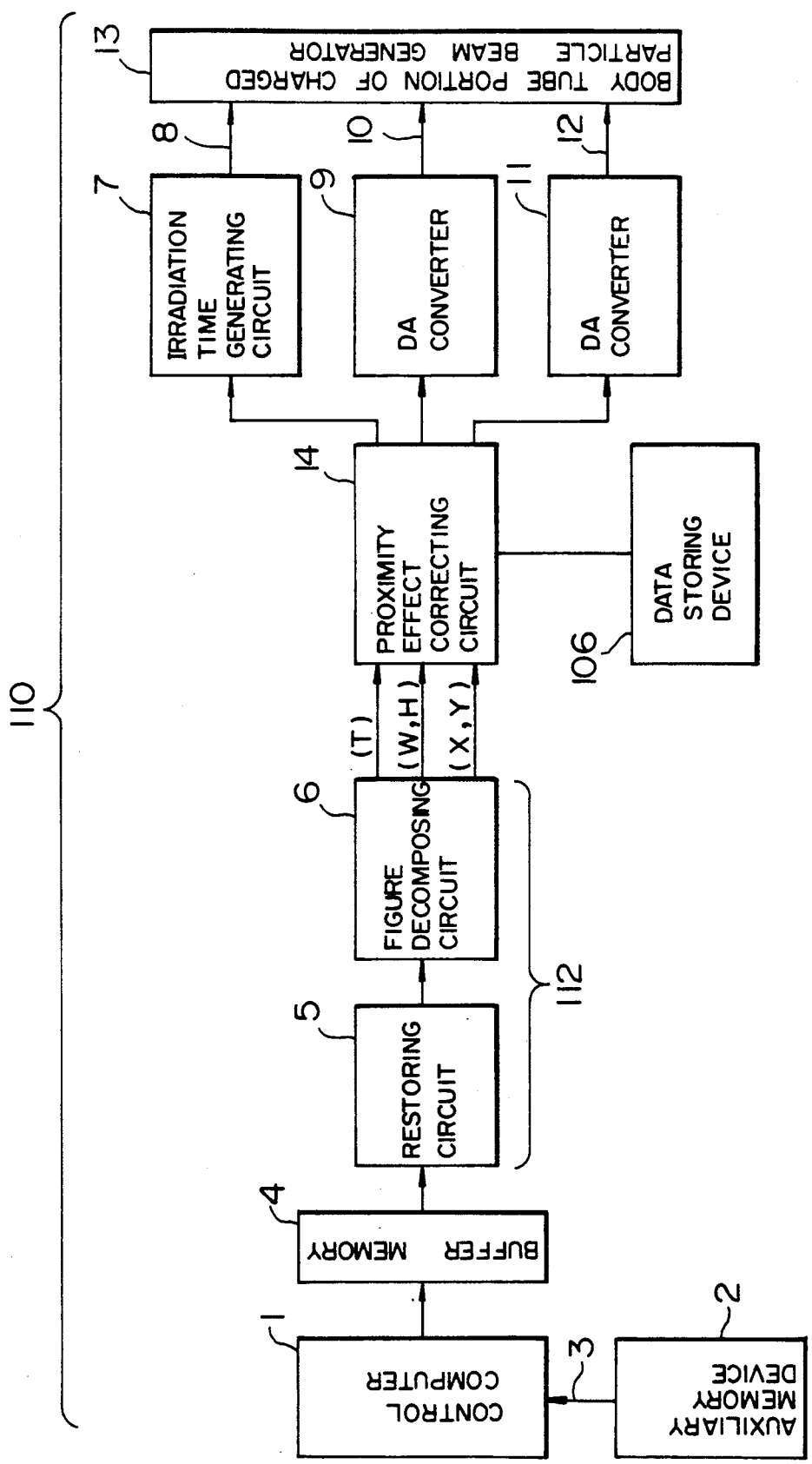
FIG. 3 is a block diagram indicating the whole construction of the electron beam exposure system in the same embodiment.
Figure 4:
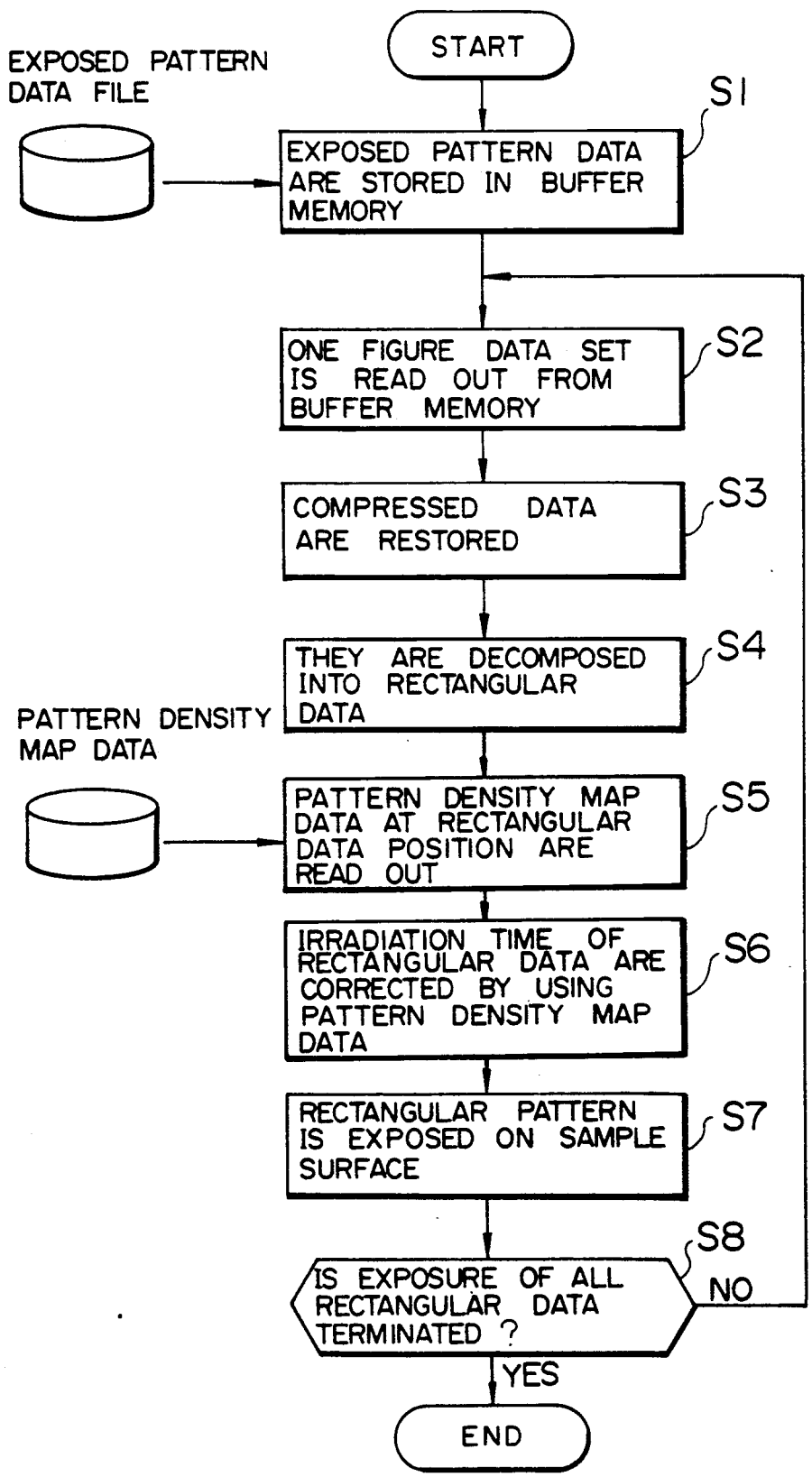
FIG. 4 is a flow chart indicating the operation of the electron beam exposure system in the same embodiment.

FIG. 3 shows the whole construction of a variable forming type charged particle beam exposure system 110 and FIG. 4 is a flow chart of the operation thereof. Exposure pattern data 3 inputted from the auxiliary memory device 2 of a control computer 1 are stored once in a high speed buffer memory 4 (S1) and read out with a high speed at the exposure (S2). The pattern data thus read out are usually those subjected to a number of data compression processings. At first, the compressed data are restored to basic figure data sets independent from each other by a restoring circuit 5 (S3). Next each basic figure is decomposed into an assembly of rectangular data sets by a figure decomposing circuit 6, each rectangle being smaller than a specified size which can be exposed at one time (S4). The output from this figure decomposing circuit 6 consists of a signal T indicating the charged particle beam irradiation time, longitudinal and transversal sizes (H, W) of the rectangular figure, and positional coordinates (X, Y). In a prior art exposure system, the irradiation time T was inputted directly to an irradiation time generating circuit 7 to be transformed into a charged particle beam irradiation/non-irradiation timing signal 8; the longitudinal and transversal sizes (H, W) were inputted directly to a DA converter 9 to be transformed into an analogue deflection signal 10 for forming the cross-section of the charged particle beam, further the positional coordinates (X, Y) were inputted directly to a DA converter 11 to be transformed into an analogue signal 12 for the positional deflection, all of them being used for the control of the exposure in the body tube portion 13 of the charged particle beam generator.

That is, an exposure control circuit 112 of the variable forming type charged particle beam exposure system 110 is constructed so as to output the position (X, Y) of the rectangular figure, the longitudinal and transversal sizes (W, H) of the rectangular figure and the duration T during which the pattern is irradiated with charged particles as control data, every time a rectangular figure is exposed. According to the present invention, the electron beam can have the optimum irradiation energy amount owing to a proximity effect correcting circuit 14 and a data storing device 106 newly added after the figure decomposing circuit 6 as indicated in the figure.

Next, the content of the processing of the proximity effect correcting circuit 14 and the data storing device will be explained more in detail.

Figure 5:
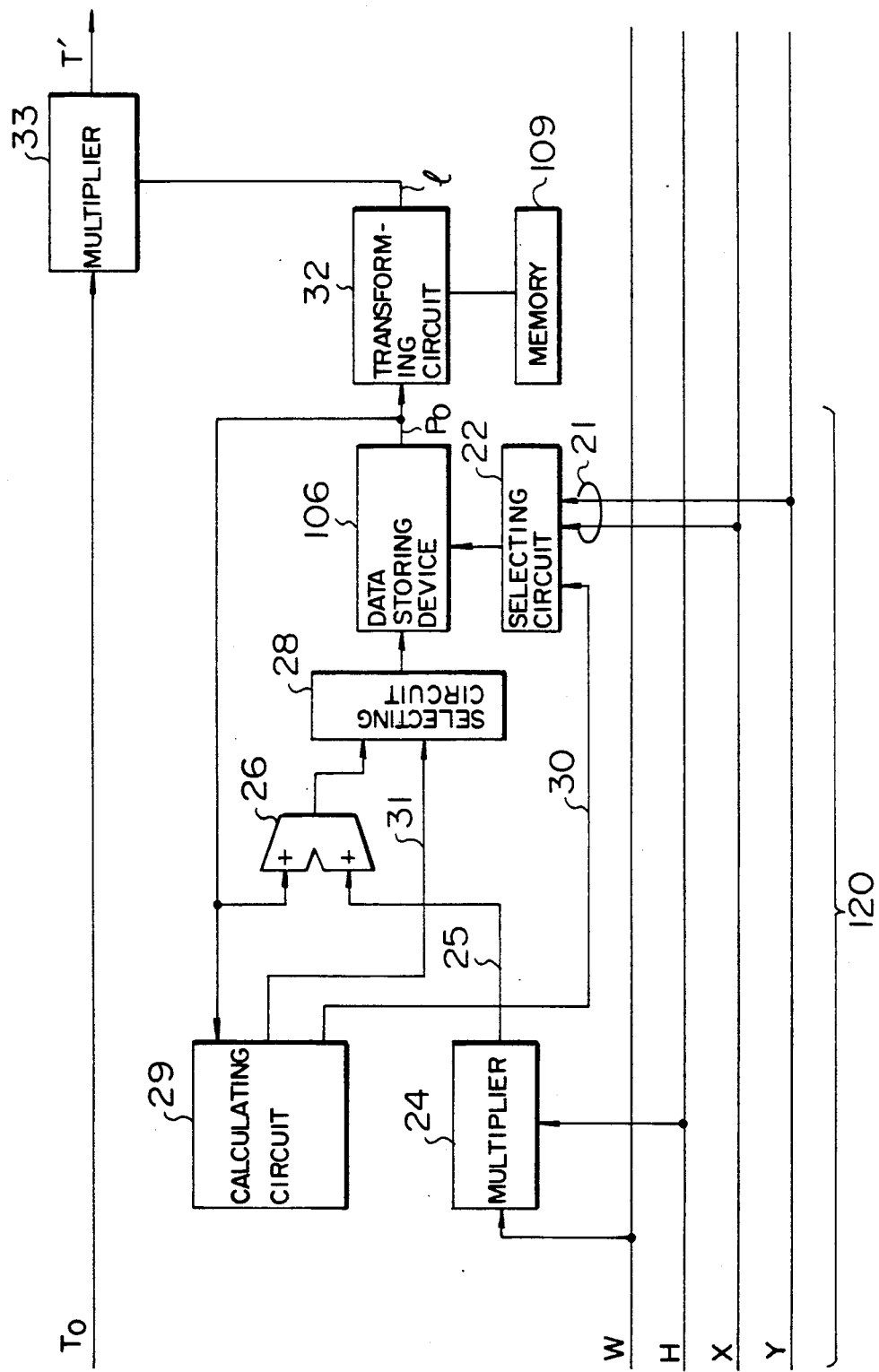
FIG. 5 is a scheme showing a data storing device for storing pattern density map data and a device for correcting the irradiation time with an electron beam on the basis of the data in the same embodiment.
Figures 6, 7:
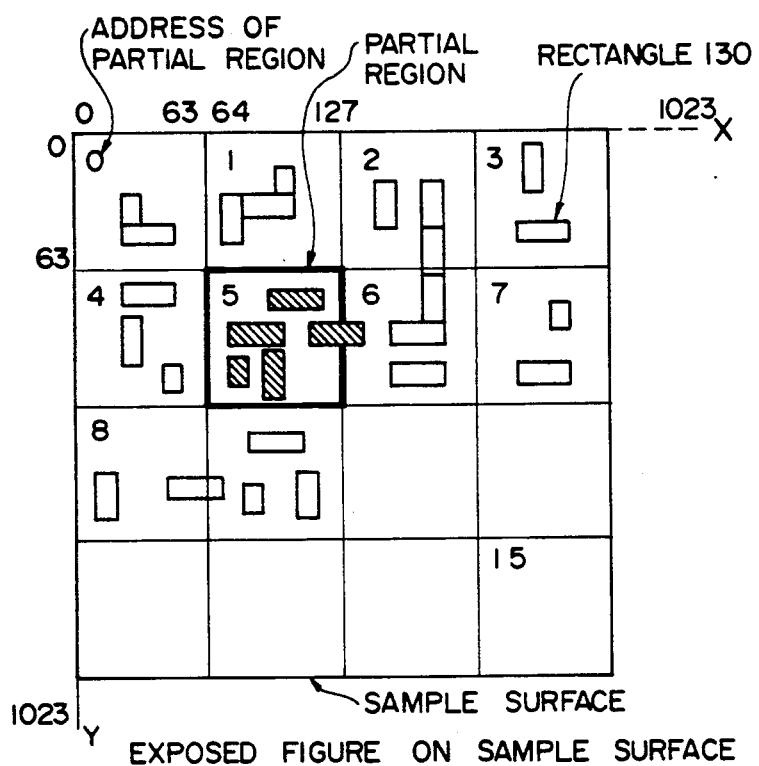
FIG. 6 is an enlarged plan view indicating partial regions and rectangles on the sample surface.
FIG. 7 is a scheme indicating addresses for the data storing device.

At first, the formation of pattern density map data for the layer irradiated with the electron beam and the storage thereof will be explained, referring to FIGS. 5 to 7. That is, in the present embodiment the case where the influences of the pattern in the layer under the relevant layer irradiated with the electron beam can be neglected will be explained. The pattern density to be obtained is $p_0$ in Eq. (2) described above. FIG. 5 shows a device 120 for writing the pattern density map data in the data storing device 106. Further, in order to make the following explanation understandable, it is supposed that the positional coordinates X and Y on the sample surface range from 0 to 1023, as indicated in FIG. 6, i.e. each of the coordinates X and Y has 12 bits. Now, when a numerical value 21 of 8 bits, in which the most significant 4 bits are the most significant 4 bits of Y and the least significant 4 bits are the most significant 4 bits of X, represents an address input in the data storing device 106 through a selecting circuit 22, a partial region, for which Y is between 0 and 63 X is between 0 and 63 and, corresponds to address 0 in the data storing device 106 and another partial region, for which Y is between 0 and 63 and X is between 64 and 127, corresponds to address 1. In this way each of the partial regions produced by dividing the whole region by $64 \times 64$ corresponds to a predetermined address in the data storing device 106 (refer to FIG. 7).

For one of the rectangles 130 to be exposed, obtained by dividing the whole region by means of the figure decomposing circuit 6, the area W x H (cross-section of the beam) is calculated by a multiplier 24. Then the value of the area is stored at the address in the data storing device 106 corresponding to the partial region containing the coordinates X and Y of the rectangle 130 through a selecting circuit 28. In the case where there exist a plurality of rectangles 130 in one partial region, the total area of them is stored at the corresponding address in the data storing device 106. This operation is executed by adding area data of a rectangle newly read-in to the area data at the relevant corresponding address by means of an adder 26. When such an operation is executed for all the rectangles to be exposed, data of the total sum of the areas to be exposed are stored for every partial region on the sample surface and thus the pattern density is obtained for every partial region.

In the above description it is supposed that "0" is written-in for all the contents of the data storing device 106 before exposing. Strictly speaking, since data of one rectangle may extend over a plurality of partial regions (refer to partial regions Nos. 5 and 6 in FIG. 6), it is impossible to calculate precisely the pattern density by this method. However, usually, since the size of the rectangles to be exposed is sufficiently small with respect to the size of the partial regions, the difference therebetween can be neglected.

Furthermore, it is possible also to smooth the pattern density map data described above. That is, the calculated numerical value for each of the partial regions is smoothed by using numerical values of partial regions in the neighborhood thereof to calculate a macroscopic exposure dose distribution. In one example of a suitable method, the numerical value of each of the partial regions is replaced by the arithmetic average of the numerical values of $5 \times 5$ partial regions around the relevant partial region That is, it is supposed that l, m = −2 to +2 in Eq. (7). In this case, the calculation is effected, assuming that the exposure dose is 0 for the partial regions outside of the pattern region. Such a calculation can be satisfactorily executed merely by adding a usual calculating circuit 29 to the data storing device 106, because the contents of the data storing device 106 are merely read out therefrom, averaged and written-in again therein (refer to FIG. 5). This can be realized by inputting an address signal 30 corresponding to a desired partial region from the calculating circuit 29 to the data storing device 106 through the selecting circuit 22; effecting smoothing calculation by using the output $p_0$ of the data storing device 106 at that time; and writing-in again the result thus obtained in the data storing device through the selecting circuit 28. It is a matter of course that no calculating circuit exclusively used therefor is added, but the content of the data storing device may be read in to the control computer of the exposure system and the result thus obtained may be written again in the data storing device after the calculation.

The operation described above is effected prior to the exposure of one pattern and the map data which have been once stored, are repeatedly used as far as a same pattern is exposed.

On the other hand, the energy ratio $k_0$ and the optimum irradiation energy amount $I_0$, when it is supposed that there is no back scattering, are obtained experimentally, corresponding to each of the patterns.

In the present embodiment, in view of the fact that the irradiation energy amount per unit cross-section and per unit time is constant, the real optimum irradiation energy amount I obtained by using Eq. (2) is proportional to the irradiation time T, and irradiation time is adjusted by varying the irradiation time with the electron beam. That is, the optimum irradiation time T' in practice for suppressing the influences of the proximity effect is given by;

$$T = T_0 \times \{1/(1+2 \times p_0 \times k_0)\} \qquad (2)'$$

where $T_0$ is the irradiation time corresponding to the optimum irradiation energy amount $I_0$, when it is supposed that there is no back scattering. The time $T_0$ is given as an irradiation time data of the rectangular data outputted from the figure decomposing circuit 6.

Now the method for correcting the irradiation time $T_0$, by which the pattern is exposed so that the proximity effect is corrected by using the data map of the pattern density $p_0$ described above and $k_0$, will be explained, while referring to FIG. 4.

The pattern density $p_0$ (which is smoothed) in the partial region containing the positional coordinates of the rectangular data to be really exposed is read out from the data storing device 106 (Step 5). In Step 6, on the basis of the information on the pattern density $p_0$ the transforming circuit 32 reads out the corresponding energy ratio $k_0$ from the memory 109 and executes an operation $$\{1/(1+2 \times p_0 \times k_0)\} = l \qquad (9)$$

in Eq. (2)' to output the correction coefficient l to the multiplier 33. Another transforming circuit can be connected to the data storing device 106 so that the coefficient l as to the all density $p_0$ calculated with the predetermined ratio $k_0$ by using the transforming circuit are also stored in the data storing device 106. And the correction coefficient l is read out from the device 106 corresponding to the density $p_0$ of the rectangular data to be really exposed. The multiplier 33 multiplies To by the relevant correction coefficient 1 to calculate the optimum irradiation time T'.

Although, in the above description, explanation was made for the case where the irradiation time with the electron beam is corrected on the basis of Eq. (2)', if $2 \times p_0 \times k_0 << 1$, Eq. (9) approximates a linear equation including the density $p_0$ so that the irradiation time can be calculated by using addition and subtraction. In this case an adder-subtracter is used in lieu of the multiplier 33.

Further, in order to smooth variations in the exposure dose, it is possible also to obtain the pattern density $p_0$ at the position of each of the figures by linear interpolation using the pattern density in the partial regions in the neighborhood thereof, assuming that the value of each of the partial regions can be represented by the value at the central position of the relevant partial region. In this way the correction of the proximity effect can be effected further finely. Also in this case, although the circuit is more complicated than that used in the embodiment described above, this can be carried out easily by the usual circuit technique. The exposure is effected by the usual method for all the partial regions (S7, S8).

Figure 8A:
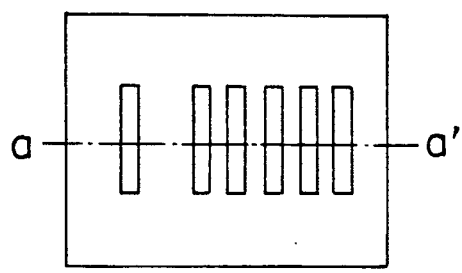
FIGS. 8A to 8G are schemes for explaining the effect of correcting the proximity effect in the present embodiment.
Figure 8B:
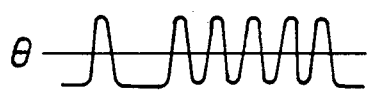
Figure 8E:
Figure 8C:
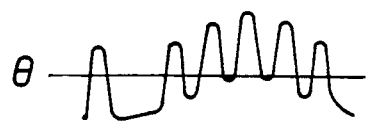
Figure 8F:
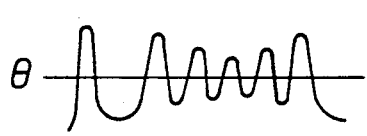
Figure 8D:
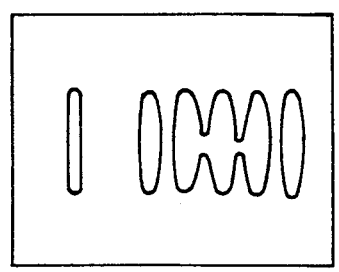
Figure 8G:
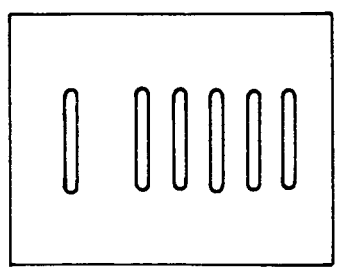

Next the effect of the present embodiment will be explained specifically, referring to FIGS. 8A–8G. FIG. 8A shows a figure pattern to be exposed. It is supposed that the figure to be exposed consists of one narrow elongated figure on the left side and five figures identical thereto from the central portion to the right side. Now, when variations in the exposure dose of the charged particle beam for exposing them are indicated along the line a—a', if there were no reexposure due to scattering from the interior of the substrate, they would be ideally exposed in an extent of the fading of the charged particle beam, as indicated in FIG. 8B, when they are exposed only uniformly. Consequently, when they are developed at an exposure level $\theta$, the figure should be able to be formed in a desired shape. However, in reality, since there is reexposure due to scattering from the interior of the substrate, excessive exposure takes place where the exposed area is large, as indicated in FIG. 8C. In this case, if the development were effected at the exposure level 8, a faded figure as indicated in FIG. 8D would be formed and it would be difficult to form a fine figure any more. This is the phenomenon called proximity effect. According to the present invention, in order to correct this proximity effect, at first a region to be exposed is divided into a plurality of partial regions and the area to be exposed in each of the partial regions is calculated. The result thus obtained is smoothed. In this way it is possible to obtain a waveform representing an approximate variation in the exposure dose, as indicated in FIG. 8. Therefore, when the exposure is effected so that the exposure dose is decreased where this waveform is high and it is increased where this waveform is low, a waveform as indicated in FIG. 8F as the real exposure dose can be obtained. If the exposure dose varies as indicated in FIG. 8F, when the development is effected at the exposure level $\theta$, it is possible to form a figure pattern having an almost desired line width, as indicated in FIG. 8G. As described above, when the present invention executed in practice, it is possible to form a desired fine figure, decreasing the influences of the proximity effect.

Although, in the present embodiment, only a variable forming type charged particle beam exposure system using a beam having a rectangular cross-section has been discussed, even with a charged particle beam having an arbitrary polygonal cross-section such as triangular, L-shaped, etc., since the exposure system includes a numerical signal controlling the shape, it is possible to calculate the cross-sectional area by means of a calculating circuit and thus to carry out easily the present invention. Even with an exposure system having a function of selecting an aperture for variable forming having the shape of a specified circuit pattern to be able to expose repeatedly the pattern, since the exposed area of the specified pattern is previously known, the present embodiment can be applied as well by using the area as a parameter and by accumulatively adding it.

On the whole construction of the electron beam exposure system used in the embodiment described above, refer, to, for example, "Variable Spot Shaping for Electron-beam Lithography" H. C. Pfeiffer, Fourteenth Symposium on Electron, Ion, And Photon, Beam Technology, 1978, pp 887–890. For the charged particle beam an ion beam, etc., can be used.

Figure 9:
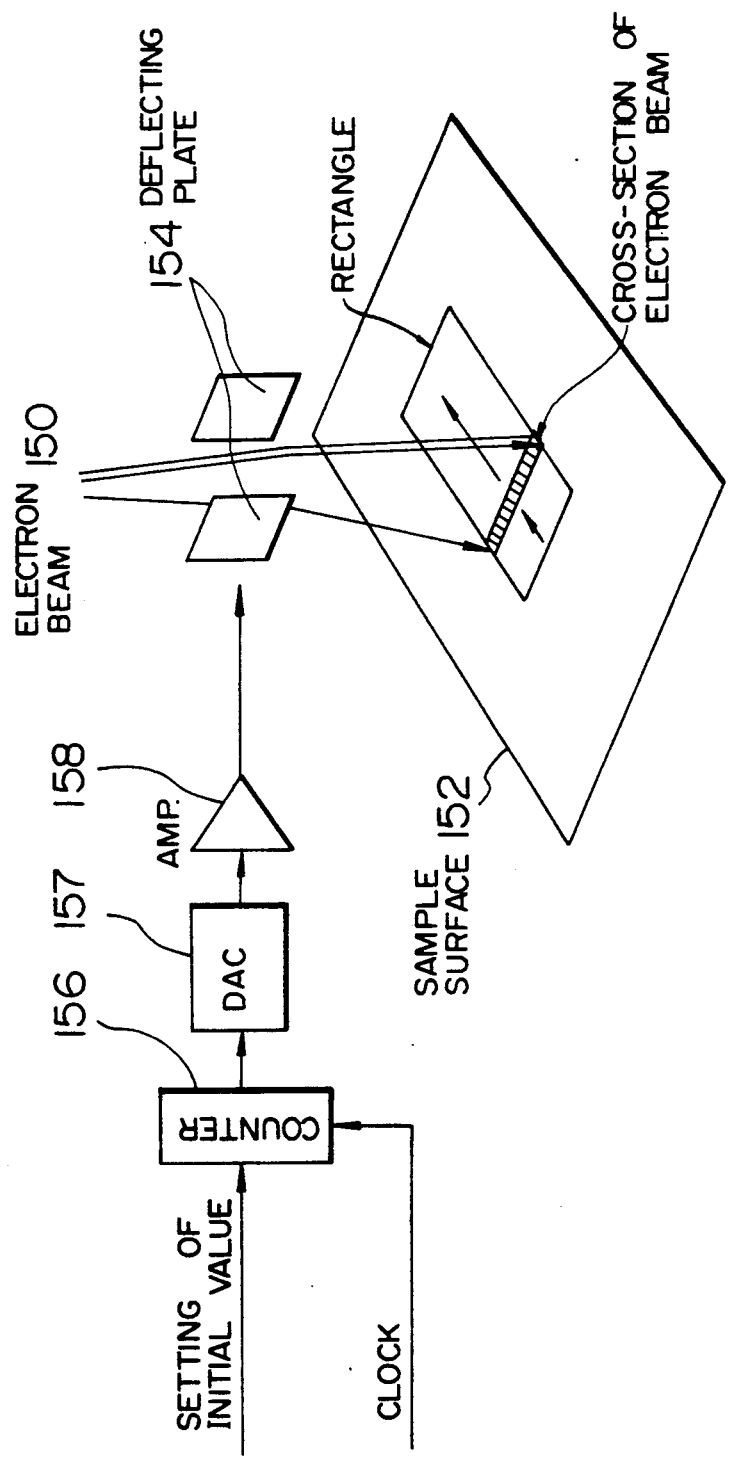
FIG. 9 is a scheme showing the construction of an electron beam exposure system of type in which a pattern is scanned with an electron beam to be exposed and to which the present invention can be applied.

Further, even with an exposure system in which a sample surface 152 is scanned with a charged particle beam 150 having a punctual or formed cross-section to expose a rectangle 130, as indicated in FIG. 9, if the scanning distance is considered to be sectioned, it is possible to calculate the exposed cross-sectional area equivalent thereto. However, in this case, the regulation of the exposure dose can be effected by varying the cross-section of the charged particle beam or the scanning speed, depending on the area to be exposed.

In FIG. 9, reference numeral 154 in the figure represents deflecting plates 154 and reference numerals 156, 157 and 158 are a counter, a digital-analogue converter and an amplifier, respectively, for controlling the deflecting plates.

The embodiment explained below is applied to the case where a pattern on a layer (hereinbelow called "underlayer") located under the layer (hereinbelow called "pattern forming layer"), on which a pattern is to be formed, has influences on the proximity effect. That is, it is an example where Eqs. (4) and (5) are applied.

At first, the pattern densities $p_0$ and $p_1$ on the pattern forming layer and the underlayer, respectively, are stored in the data storing device 106 in the form of map data in the same way as in the preceding embodiment (refer to FIG. 5). On the other hand the energy ratios $k_0$ and $k_1$ are stored in the memory 109. The optimum irradiation time $T_0$ in the case where the influences of the underlayer can be neglected is obtained in the same way as in the preceding embodiment.

The operation in the present embodiment will be explained, referring to the flowchart indicated in FIG. 10. The steps in the flowchart indicated in FIG. 10, in which the same operations as those in the flow-chart indicated in FIG. 4 are performed, are referred to by the same reference numerals and explanation thereof will be partly omitted. That is, the steps characterizing the present embodiment are S100 to S500.

In Step 100, the pattern density $p_o$ (not smoothed) in the partial region on the pattern forming layer including positional coordinates of the rectangular data, which are really to be exposed, is read out from the data storing device 106. In Step 200, the pattern density $p_0$ read out in Step 100 is smoothed on the basis and the pattern density $\underline{p}_0$ thus obtained is of Eq. (7) and the pattern density $\underline{p}_0$ thus obtained is stored again in the data storing device 106.

In Step 300, the pattern density $p_1$ of the partial region in the underlayer including the same positional coordinates as the positional coordinates of the rectangular data, which are to be exposed, is read out from the data storing device 106. Then, in Step 400, the pattern density $p_1$ is smoothed on the basis of Eq. (7) and the average pattern density $\bar{p}_1$ thus obtained is stored again in the data storing device 106.

In step 500, the transforming circuit 32 reads out $\bar{p}_0$ and $\bar{p}_1$ from the data storing device 106 and $k_0$ and $k_1$ from the memory 109. The operation in [ ] in Eq. (4) is executed and the correction coefficient l is outputted to the multiplier 33. Then the multiplier 33 multiplies To by the relevant correction coefficient l and calculates the optimum irradiation time T'.

Further, in order to increase the calculation speed in Step 500, it is desired to execute the operation in Eq. (5) and to store the value of P thus obtained in the data storing device 106. In this case, a circuit for executing the operation in Eq. (5) is added to the data storing device 106 and a memory for storing the parameters $k_0$ and $k_1$ is connected with the circuit stated above. Furthermore, since Eq. (2)' is calculated in the transforming circuit 32, only $k_0$ is stored in the memory 109.

In addition, in Step 500, it is possible also to execute the operation in Eq. (8) in the same way as described above and to store the value of P' thus obtained in the data storing device.

Furthermore, in the present specification the following items will be disclosed in addition to the embodiment described above. It is a matter of course that the technical scope of the present invention is not limited to these descriptions, but covers also the scope, which those skilled in the art can consider easily.

Although the above embodiments are so constructed that the data storing device is added to the proximity effect correcting device of the electron beam exposure system, the proximity effect correcting circuit can be disposed also between the electron beam exposure system and a large scale computer in the form of a separate device. Further the correcting circuit can have the operation executed by the large scale computer.

In the theory for correcting the irradiation energy amount with an electron beam, which has been already described and Eqs. (1) to (6) based on the theory, the data serving as the foundation of the correction were the density of the area of the pattern.

However, even for a same area density, the back scattered energy amount varies too, depending on the length of the irradiation time with the beam. Consequently it is preferable to multiply $\bar{p}_0$, pl, etc. in different equations by a time parameter.

Specifically, in the step of forming the pattern density in the different partial region, in lieu of adding accumulatively the area ($W \times H$) of the rectangular data, area $\times$ irradiation time ($W \times H \times T$) is added accumulatively. A data map is formed by using it as the exposure dose in each of the partial regions. How to use this exposure dose data map has been already explained in the different embodiments described previously.

The calculation of the exposure dose for each of the partial regions may be done only once, when new exposure pattern data are set. If there is disposed means for storing that value as data annexed to the exposure pattern data, it can be read out to be used for the exposure of a same pattern as many times as desired. This is a processing of at most about several minutes, as described previously, for the control circuit in the exposure system. Consequently, if the present invention is carried out, the proximity effect correcting calculation of several tens to several hundreds of hours by means of the large scale computer described above can be omitted only by effecting a preliminary processing of several minutes by means of the exposure system. Therefore the present invention has an extremely high practical value.

We claim:

1. A method of exposing a pattern on a surface of a sample using a charged particle beam comprising:

a step of dividing the surface where the pattern should be formed into predetermined partial regions and storing the pattern area density in each of said partial regions in the form of pattern density map data; and a step of correcting exposure dose with said charged particle beam previously set for every irradiation unit, referring to said pattern density map data at the irradiation with said charged particle beam, in order to suppress the proximity effect.

2. A method of exposing a pattern according to claim 1, wherein said charged particle beam is an electron beam.

3. A pattern exposure apparatus for exposing a pattern on a surface of a sample using a charged particle beam comprising:

a main body of the apparatus for irradiating a sample with said charged particle beam provided with a charged particle source and means for accelerating, focusing and deflecting charged particles emitted by said charged particle source to irradiate a surface of said sample, where the pattern should be formed, therewith in the form of a beam;

means for dividing the surface where the pattern should be formed into predetermined partial regions and storing the pattern area density in each of said partial regions in the form of pattern density map data; and first means for correcting exposure dose with said charged particle beam previously set for every irradiation unit, referring to said pattern density map data at the irradiation with said charged particle beam, in order to suppress the proximity effect.

4. A pattern exposure apparatus for exposing a pattern according to claim 3, further comprising second means for forming said pattern density map data.

5. A pattern exposure apparatus for exposing a pattern according to claim 4, wherein said second means for forming said pattern density map data comprises means for integrating irradiation areas, each of which constitutes an irradiation unit to be irradiated, for every partial region and means for writing the result of the integration in said data storing means.

6. A pattern exposure apparatus for exposing a pattern according to claim 4, wherein said main body of the apparatus for irradiating a sample with said charged particle beam exposes a figure of irradiation unit by one irradiation with said charged particle beam having a constant cross-section and a fixed position; and said second means comprises means for calculating the cross-section of said charged particle beam and means for integrating the cross-section for every partial region.

7. A pattern exposure apparatus for exposing a pattern according to claim 4, wherein said main body of the apparatus for irradiating a sample with said charged particle beam exposes a figure of irradiation unit by scanning a surface of the sample with said charged particle beam having a constant or varying cross-section; and said second means comprises means for calculating the area of a figure of irradiation unit, starting from the cross-section of said charged particle beam and the scanning distance, as well as means for integrating the area thereof for every partial region.

8. A pattern exposure apparatus for exposing a pattern according to claim 3, wherein said first means corrects the irradiation dose with said charged particle beam for every irradiation unit on the basis of the pattern density in the partial region, where the relevant irradiation unit should be exposed.

9. A pattern exposure apparatus for exposing a pattern according to claim 8, wherein said first means corrects the irradiation dose with said charged particle beam by varying the irradiation time.

10. A pattern exposure apparatus for exposing a pattern according to claim 9, wherein the variation in the irradiation time executed by said first means is to calculate $$T_0 \times \{1/(1+2 \times p_0 \times k_0)\},$$

where $T_0$ represents the irradiation time previously set, supposing that there is no back scattering; $p_0$ the pattern density; and $k_0$ the ratio of the exposure energy amount for a part, where there is a pattern, when back scattering is taken into account, to the exposure energy amount for a part, where there is no pattern.

11. A pattern exposure apparatus for exposing a pattern according to claim 3, further comprising third means for correcting the pattern density at a partial region, where an irradiation unit should be exposed, by using the pattern density at other partial regions in the neighborhood of the relevant partial region, wherein said first means corrects the irradiation dose with said charged particle beam for every irradiation unit on the basis of the pattern density corrected by said third means.

12. A pattern exposure apparatus for exposing a pattern according to claim 11, wherein said third means corrects the pattern density at each of the partial regions by forming an arithmetic mean of the pattern density at the relevant partial region and the pattern densities at other partial regions in the neighborhood thereof or an arithmetic mean of them, multiplying them by weights corresponding to the distances therebetween.

13. A pattern exposure apparatus for exposing a pattern according to claim 12, further comprising means for obtaining the pattern density thus corrected by interpolation using the pattern density corrected similarly of other partial regions in the neighborhood thereof, wherein said first means corrects the irradiation dose with said charged particle beam for every irradiation unit on the basis of the pattern density thus lineraly interpolated.

14. A pattern exposure apparatus for exposing a pattern according to claim 11, further comprising means for storing the pattern density corrected by said third means correcting the pattern density for every partial region.

15. A pattern exposure apparatus for exposing a pattern according to claim 3, wherein said charged particle beam is an electron beam.

16. A method of exposing a pattern on a surface of a sample using a charged particle beam comprising:

a step of dividing the surface where the pattern should be formed into predetermined partial regions and storing the pattern area density in each of said partial regions in the form of pattern density map data;

further a step of dividing one or a plurality of layers located under the layer, on which the pattern should be formed, and having substantially patterns themselves, corresponding to said partial regions and storing the pattern area density in each of said partial regions in said layers located under said relevant layer in the form of pattern density map data; and a step of correcting exposure dose with said charged particle beam previously set for every irradiation unit, referring to said first and said second pattern density map data at the irradiation with said charged particle beam, in order to suppress the proximity effect.

17. A pattern exposure apparatus for exposing a pattern on a surface of a sample using a charged particle beam comprising:

a main body of the apparatus for irradiating a sample with said charged particle beam provided with a charged particle source and means for accelerating, focusing and deflecting charged particles emitted by said charged particle source to irradiate a surface of said sample, where the pattern should be formed, therewith in the form of a beam;

first storing means for dividing the surface where the pattern should be formed into predetermined partial regions and storing the pattern area density in each of said partial regions in the form of first pattern density map data;

second storing means for dividing one or a plurality of layers located under the layer, on which the pattern should be formed, and having substantially patterns themselves, corresponding to said partial regions and storing the pattern area density in each of said partial regions in said layers located under said relevant layer in the form of second pattern density map data; and first means for correcting exposure dose with said charged particle beam previously set for every irradiation unit, referring to said first and said second pattern density map data, at the irradiation with said charged particle beam, in order to suppress the proximity effect.

18. A pattern exposure apparatus for exposing a pattern according to claim 17, further comprising second means for calculating $$P = p_0 \times \{1+(k_1/k_0-1) \times p_1\}$$

where $p_0$; pattern density in the layer where the pattern should be formed, $p_1$; pattern density in the under layer $k_0$; ratio of the exposure energy amount for a part, where there is a pattern on the pattern forming surface, when there is no pattern in the underlayer, to the exposure energy amount for a part, where there is no pattern.

$k_1$; ratio of the exposure energy amount for a part, where there is a pattern on the pattern forming surface, when there exists a pattern in whole in the underlayer, to the exposure energy amount for a part, where there is no pattern.

19. A pattern exposure apparatus for exposing a pattern according to claim 18, wherein said first means calculates $$T_0 \times \{1/(1+2 \times P \times k_0)\},$$

where $T_0$ represents the irradiation time previously set, supposing that there is no back scattering, and corrects the irradiation time $T_0$ previously set with said charged particle beam.

20. A pattern exposure apparatus for exposing a pattern on a surface of a sample using a charged particle beam comprising:
   a main body of the apparatus for irradiating a sample with said charged particle beam provided with a charged particle source and means for accelerating, focusing and deflecting charged particles emitted by said charged particle source to irradiate a surface of said sample, where the pattern should be formed, therewith in the form of a beam;
   means for dividing the surface where the pattern should be formed into predetermined partial regions and storing the exposure dose in each of said partial regions in the form of exposure dose map data; and
   first means for correcting exposure dose with said charged particle beam previously set for every irradiation unit, referring to said exposure dose map data at the irradiation with said charged particle beam, in order to suppress the proximity effect.

21. A pattern exposure apparatus for exposing a according to claim 20, wherein said exposure dose is given by
   area of pattern x irradiation time.

22. A pattern exposure apparatus for exposing a pattern on a surface of a sample using a charged particle beam comprising:
   a main body of the apparatus for irradiating a sample with said charged particle beam provided with a charged particle source and means for accelerating, focusing and deflecting charged particles emitted by said charged particle source to irradiate a surface of said sample, where the pattern should be formed, therewith in the form of a beam;
   first storing means for dividing the surface where the pattern should be formed into predetermined partial regions and storing the exposure dose in each of said partial regions in the form of first exposure dose map data;
   second storing means for dividing one or a plurality of layers located under the layer, on which the pattern should be formed, and having substantially patterns themselves, corresponding to said partial regions and storing the exposure dose in each of said partial regions in said layers located under said relevant layer in the form of second exposure dose map data; and
   first means for correcting exposure dose with said charged particle beam previously set for every irradiation unit, referring to said first and said second exposure dose map data, at the irradiation with said charged particle beam, in order to suppress the proximity effect.

* * * * *